(12) United States Patent
Agnaou et al.

(10) Patent No.: US 11,774,500 B2
(45) Date of Patent: Oct. 3, 2023

(54) METHOD AND DEVICE FOR DETECTING THE TRIPPING OF A DISCONNECTION UNIT, AND ELECTRICAL ENCLOSURE COMPRISING SUCH A DEVICE

(71) Applicant: Schneider Electric Industries SAS, Rueil-Malmaison (FR)

(72) Inventors: Abderrahmane Agnaou, Grenoble (FR); Yannick Neyret, Biviers (FR); Laurent Goupil, La Tour du Pin (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 188 days.

(21) Appl. No.: 17/331,830

(22) Filed: May 27, 2021

(65) Prior Publication Data
US 2021/0382111 A1   Dec. 9, 2021

(30) Foreign Application Priority Data
Jun. 4, 2020   (FR) ...................................... 2005861

(51) Int. Cl.
*G01R 31/327* (2006.01)
*H02H 1/00* (2006.01)

(52) U.S. Cl.
CPC ....... *G01R 31/3274* (2013.01); *H02H 1/0007* (2013.01); *H02H 1/0092* (2013.01)

(58) Field of Classification Search
CPC .............. G01R 31/3274; G01R 31/327; H02H 1/0007; H02H 1/0092; H01H 2071/042;
(Continued)

(56) References Cited

U.S. PATENT DOCUMENTS

2015/0070020 A1* 3/2015 Michaux ............... G01R 31/327
324/424
2015/0153414 A1* 6/2015 Mills .................... G01R 31/327
324/424
(Continued)

FOREIGN PATENT DOCUMENTS

| EP | 2731217 A1 | 5/2014 |
|---|---|---|
| WO | 9607192 A2 | 3/1996 |
| WO | 2015020653 A1 | 2/2015 |

OTHER PUBLICATIONS

French Search Report and Written Opinion dated Jan. 29, 2021 for French Patent Application No. FR2005861, 6 pages.

*Primary Examiner* — Jermele M Hollington
*Assistant Examiner* — Zannatul Ferdous
(74) *Attorney, Agent, or Firm* — Locke Lord LLP (57) ABSTRACT

A method for detecting a tripping of a disconnection unit in an electrical enclosure, the electrical enclosure including at least one disconnection unit for disconnecting electric current and at least one switching unit for switching the electric current, the method including a learning phase configured to generate decision-making categories associated with an acoustic signature of the tripping of the at least one disconnection unit, and a phase of detecting the tripping of the disconnection unit, including:
  acquiring a unit noise signal generated by at least one of the disconnection units for disconnecting the electric current or at least one switching unit for switching the electric current, and
  comparing the unit noise signal with the decision-making categories in order to detect whether the unit noise signal corresponds to the tripping of the disconnection unit.

14 Claims, 7 Drawing Sheets

(58) Field of Classification Search
CPC ....... H01H 2071/048; H01H 2239/048; H01H 71/04; G06F 18/24; G06N 3/08; G06N 20/00
See application file for complete search history.

(56) References Cited

U.S. PATENT DOCUMENTS

2016/0180687 A1* 6/2016 Schroeder ............ H02H 1/0061
340/638
2019/0190247 A1* 6/2019 Bernard ................ G01R 31/52

* cited by examiner

METHOD AND DEVICE FOR DETECTING THE TRIPPING OF A DISCONNECTION UNIT, AND ELECTRICAL ENCLOSURE COMPRISING SUCH A DEVICE

TECHNICAL FIELD

The present invention relates to a method and a device for detecting the tripping of a disconnection unit, and to an electrical enclosure comprising such a device.

The invention relates more generally to the technical field of protecting electrical installations.

The invention applies in particular to units for managing an electric current, for example electrical protection units for breaking an electric current, such as low-voltage circuit breakers.

BACKGROUND

Disconnection units are controlled by an actuating mechanism driven by a trip and are used to very quickly interrupt an electric current as soon as an electrical fault occurs. Generally speaking, these units are installed in an electrical enclosure next to switching units such as contactors and remote switches which are themselves switched when they receive a switching order sent by an entity external to the installation.

It is desirable to be able to quickly identify when a protection unit has been tripped following an electrical fault, for example in order to intervene manually, via an electrician, in order to reset the unit and, where applicable, to remedy the problem that caused the electrical fault, while avoiding despatching an electrician for a false alarm.

There are protection units equipped with radio communication systems which allow information on their state to be sent. However, these solutions are expensive to implement, in particular in installations comprising a large number of units, and it is not always possible to deploy them in existing installations when it is not desired to replace all of the units.

SUMMARY

It is this drawback which the invention more particularly aims to overcome, by providing a method for acoustically detecting tripping of a disconnection unit in an electrical enclosure and an associated detection device and an associated electrical enclosure.

To that end, the invention relates to a method for detecting the tripping of a disconnection unit in an electrical enclosure, this electrical enclosure comprising at least one disconnection unit for disconnecting the electric current and at least one switching unit for switching the electric current, the method comprising a learning phase able to generate decision-making categories associated with an acoustic signature of the tripping of said at least one disconnection unit, and a phase of detecting the tripping of the disconnection unit, comprising steps of:
  acquiring a unit noise signal generated by at least one of said disconnection units for disconnecting the electric current or at least one switching unit for switching the electric current, and
  comparing said unit noise signal with said decision-making categories in order to detect whether the unit noise signal corresponds to the tripping of the disconnection unit.

According to some advantageous but non-mandatory aspects, such a detection method may incorporate one or more of the following features, taken alone or in any technically permissible combination:
  the learning phase comprises steps of:
    injecting a predetermined disconnection current into the disconnection unit and recording the signal of the disconnection noise generated,
    sending the signal of the disconnection noise to a machine learning system able to recognize the acoustic signature of the disconnection unit and providing discrete disconnection values as output,
    grouping the discrete disconnection values together so as to create the decision-making categories,
    injecting a predetermined current into the switching unit and recording the signal of the switching noise generated,
    sending the signal of the switching noise to the machine learning system and obtaining discrete switching values as output,
    distinguishing the discrete switching values from the discrete disconnection values by modifying the decision-making categories (52) so as to exclude discrete switching values which come within these decision-making categories;
  the learning system is a neural network;
  the detection phase comprises discretizing the signal of the unit noise acquired and comparing the value obtained with the decision-making categories and if the value obtained comes within a decision-making category, sending an alarm signal;
  when an alarm signal is sent, then no tripping takes place, the noise recorded which caused the alarm is used to modify the decision-making categories;
  the injection step comprises the injection of an overload disconnection current, the injection of a differential current and the injection of a short-circuit disconnection current in order to simulate different types of electrical faults;
  the machine learning system defines at least one statistical attribute of the disconnection noise signal acquired in order to characterize the noise of the disconnection unit;
  one or more of the statistical attributes are chosen from the group comprising:
    the duration for which the intensity of the disconnection noise signal remains higher than a third predetermined percentage of the maximum intensity of the disconnection noise signal,
    an inflection point measured at a predetermined point in time before reaching a predetermined percentage of the maximum intensity of the disconnection noise signal,
    a frequency range corresponding to a measurement of the time of the first instance of reaching 100% of the intensity of the disconnection noise signal, or a mean intensity of the disconnection noise signal greater than a fourth predetermined percentage, and
    a measurement of the time of the first instance of reaching 100% of the intensity of the disconnection noise signal;
  the unit noise signal is acquired continuously;
  one of the disconnection units is modified to produce a specific sound during tripping, this specific sound being learned beforehand in the learning phase;

In addition, the invention relates to a device for detecting the tripping of a disconnection unit in an electrical enclosure comprising at least one disconnection unit for disconnecting the electric current and at least one switching unit for switching the electric current, the detection device comprising an electronic control unit able to execute the method for detecting tripping according to any one of the preceding claims, a communication interface connected to the electronic control unit able to transmit an alert signal, and a microphone connected to the electronic control unit able to acquire the unit noise signal, the disconnection noise signal and the switching noise signal.

In addition, the invention relates to an electrical enclosure comprising a device as described above installed inside the electrical enclosure, at the top of a pillar of the enclosure.

In addition, the invention relates to an electrical enclosure comprising a plurality of pillars, each pillar being equipped with a detection device as described above, installed at the top of the enclosure, with the microphone sited remotely in a region to be monitored.

In addition, the invention relates to an electrical enclosure comprising a plurality of pillars with a single pillar being equipped with a detection device as described above, placed at the top of the enclosure, with a plurality of microphones sited remotely in regions to be monitored in each pillar.

In addition, the invention relates to an electrical enclosure comprising a plurality of columns, some of which are divided into compartments, each compartment comprising a detection device as described above.

BRIEF DESCRIPTION OF THE DRAWINGS

The invention will be better understood and other advantages thereof will become more clearly apparent in the light of the following description of one embodiment of an electrical protection device provided solely by way of example and with reference to the appended drawings, in which.

DETAILED DESCRIPTION

Figure 1:
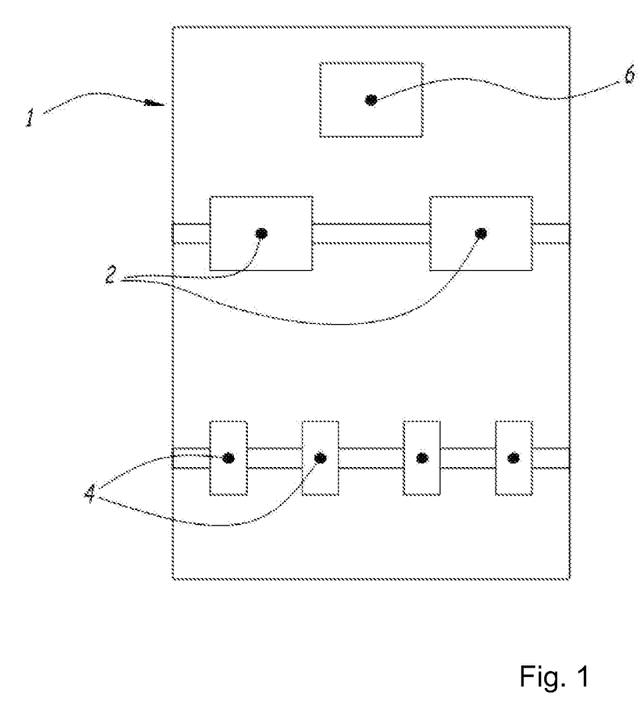
FIG. 1 schematically shows an electrical enclosure containing a detection device according to some embodiments of the present invention.

FIG. 1 shows an electrical enclosure 1 containing a plurality of disconnection units for disconnecting the electric current 2, such as a circuit breaker, a plurality of switching units 4, such as a contactor or a remote switch, and an acoustic detection device 6 according to the present invention.

Each disconnection unit 2 or switching unit 4 allows the management of an electric current flowing within an electrical installation with which the unit itself is associated, in a known manner.

For example, the disconnection units 2 are driven by an embedded trip and are used to very quickly interrupt an electric current as soon as an electrical fault occurs. In that way they differ from the switching units 4 such as contactors and remote switches which are themselves switched when they receive a switching order sent by an entity external to the installation.

In practice, the disconnection units 2 and the switching units 4 are electromechanical units comprising a switching mechanism that is movable between a closed state and an open state in order to selectively allow or interrupt the flow of electric currents through the electrical installation. Each of these units generates a specific noise during switching, in particular when it transitions from a closed state to the open state.

The acoustic detection device 6 is configured in particular to detect and recognize the noise emitted by the switching of a disconnection unit 2, as will be explained in what follows.

The electrical enclosure 1 defined above denotes all types of containers for electrical devices, in particular electrical enclosures, electrical switchboards, panels, junction boxes, ducts or cable routes. The electrical enclosure 1 is preferably associated with an electrical installation, such as an electricity distribution installation.

Preferably, the detection device 6 is installed inside the electrical enclosure 1, in a region to be monitored, for example in a pillar of the electrical enclosure 1, preferably at the top of the pillar, and will be described in detail below.

As a variant, the electrical enclosure 1 comprises a plurality of pillars, each pillar having its own detection device 6.

These two solutions are preferable for enclosures of small size such as panels.

As a variant, the electrical enclosure 1 comprises a plurality of pillars, each pillar being equipped with a detection device 6, preferably installed at the top of the enclosure, with a microphone sited remotely in a region to be monitored. This variant is suited to enclosures of large size.

As a variant, the electrical enclosure 1 comprises a plurality of pillars and a single pillar is equipped with a detection device 6, preferably placed at the top of the enclosure with microphones sited remotely in the regions to be monitored in each pillar. In other words, a plurality of microphones are connected to the same detection device 6.

As a variant, the electrical enclosure 1 comprises a plurality of pillars, some of which are divided into compartments, and each compartment comprises a standalone detection device 6. The microphone is then not necessarily remote and may be placed inside a housing of the detection device 6.

Figure 2:
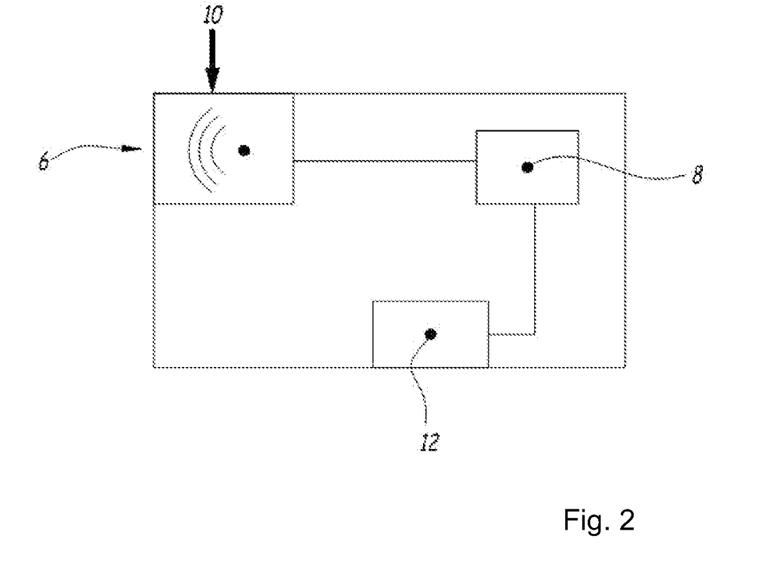
FIG. 2 schematically shows one example of the detection device of FIG. 1.

FIG. 2 schematically shows one embodiment of the detection device 6, which comprises an electronic control unit 8 for processing data, a radio communication interface 10 connected to the electronic control unit 8 and a microphone 12 connected to the electronic control unit 8.

The electronic control unit 8 is able to execute a method for detecting tripping of a disconnection unit in an electrical distribution enclosure according to the present invention.

For example, the control unit 8 comprises a processor, such as a programmable microcontroller or a microprocessor, and a computer memory forming a computer-readable data storage medium.

According to some examples, the memory is a ROM memory, a RAM memory, or an EPROM, EEPROM, flash or NVRAM non-volatile memory, or an optical memory or a magnetic memory.

The memory comprises executable instructions and/or a software code for implementing a method for acoustically detecting tripping of an electrical disconnection unit when these instructions are executed by the processor.

As variants, the control unit 8 may comprise a signal processor (DSP), or a reprogrammable logic component (FPGA), or an application-specific integrated circuit (ASIC), or any equivalent electronic circuit.

The radio communication interface 10 may be configured to implement a Bluetooth®- or Zigbee®-type short-range radio link, or a Wi-Fi-type radio link, or a 3G-, 4G- or 5G-type telecommunications link, or the like.

Figure 3:
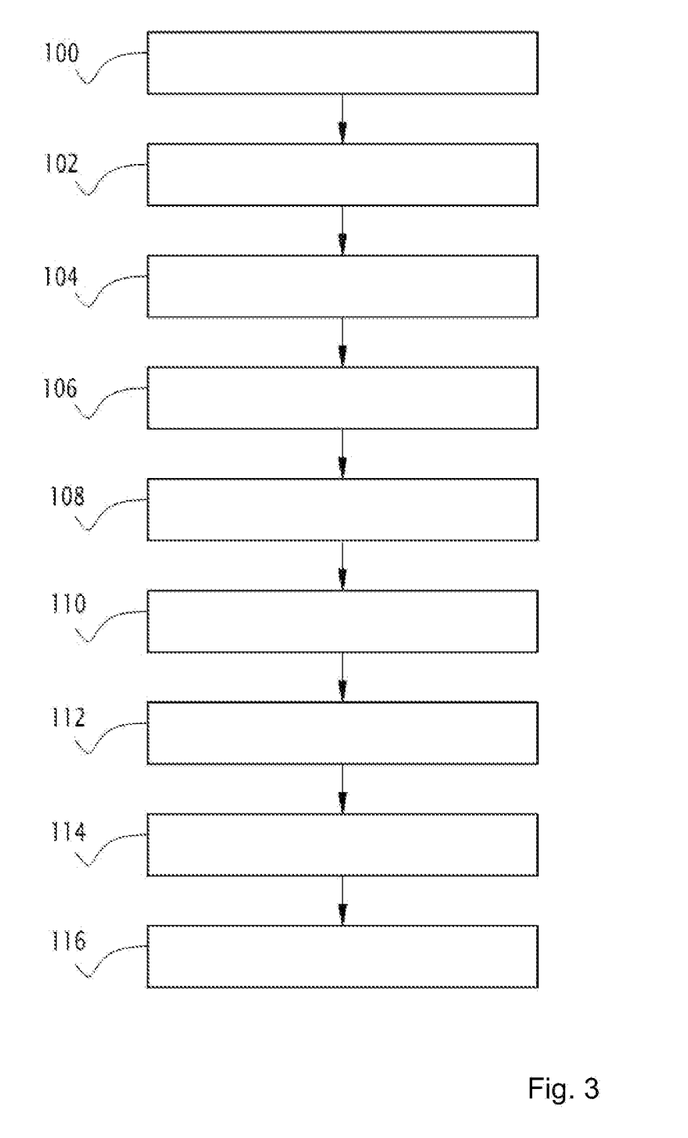
FIG. 3 shows a block diagram illustrating steps of the method for detecting the tripping of a circuit breaker in an electrical distribution enclosure according to some embodiments of the present invention.

One exemplary implementation of the method for detecting tripping is described in detail below with reference to FIG. 3, which shows a block diagram of the steps of this method.

However, as a variant, the steps could be executed in a different order. Some steps might be omitted. The described example does not prevent, in other embodiments, other steps from being implemented conjointly and/or sequentially with the described steps.

First of all, before the detection device 6 is capable of detecting tripping, a learning phase is preferably established so that the detection device 6 recognizes the acoustic signature associated with the tripping of one or more of the protection units present in the enclosure 1.

In a first step 100, each disconnection unit 2 is tested to simulate an electrical fault by injecting it with a predetermined disconnection current corresponding to its current rating. By means of its microphone 12, the device 6 records the noise generated by the unit 2 upon disconnection (disconnection noise signal), i.e. when the unit 2 transitions from the closed state to the open state. In particular, a time response and a frequency response of the noise are acquired.

The process of acquiring the noise generated by the unit 2 may comprise a filtering and extraction step in order to differentiate the sound emitted by the unit from the ambient noise.

Preferably, the first step 100 is implemented by simulating a plurality of types of electrical faults, such as overload disconnection, disconnection due to a differential current and short-circuit disconnection, in order to collect time and frequency responses for each disconnection current and each type of fault.

In a second step 102, the signals of the disconnection noise previously acquired are sent to a machine learning system, such as a neural network.

For example, the machine learning system may be implemented by the control unit 8 of the detection device 6, and/or by a computer system external to the detection device 6, although this computer system may still be in communication with the detection device 6. Preferably, the machine learning system is a supervised learning system.

Generally speaking, the machine learning system aims to recognize the acoustic signal (time response and frequency response) of each disconnection unit 2 of the electrical enclosure 1, preferably for each type of fault and/or of disconnection rating.

To do that, the machine learning system may define one or more statistical attributes on the basis of each disconnection noise signal acquired. The defining of the attributes makes it possible to characterize the noise of the disconnection units 2 in order to be able to subsequently recognize and isolate these signatures from other noises (ambient noise, switching noise of the switching units 4).

In other words, the acoustic signature of each unit 2 for each type of fault and/or of disconnection rating is defined by one or more statistical attributes.

Examples of statistical attributes will be described hereinafter with reference to FIGS. 5 to 7.

The acoustic signatures thus acquired may be recorded in a database, which may be stored in a separate computer system.

Figure 4:
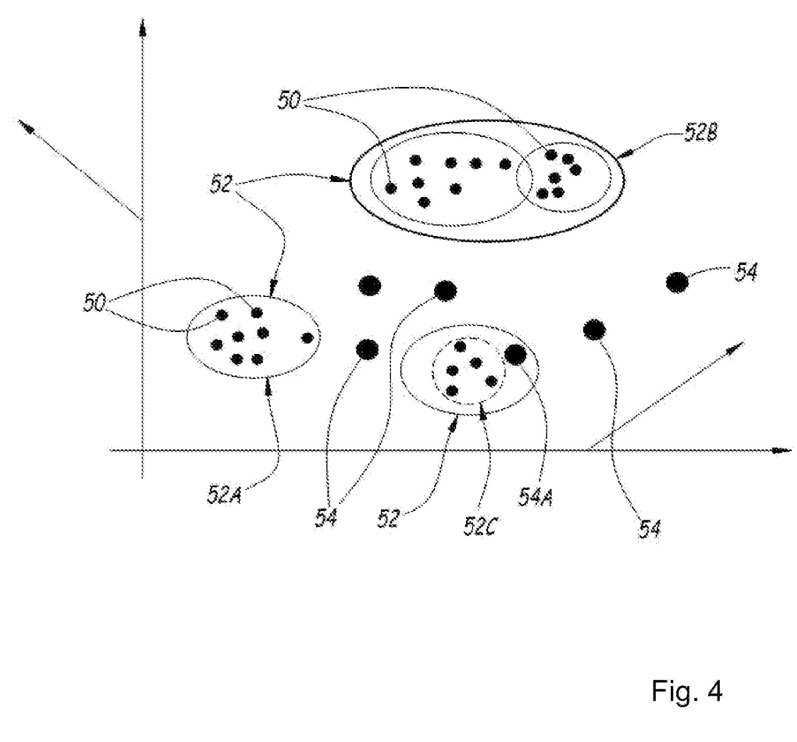
FIG. 4 is a graph showing a multidimensional reference system in which points symbolize values which represent the characterization of the noises of switching and/or disconnection devices used during a prior learning phase of the detection device of FIG. 2.

FIG. 4 shows an example of classification of the acoustic signatures by a neural network implemented by the machine learning system.

For example, the learning system provides, as output, discrete values that characterize a disconnection noise, which are arranged in a multidimensional space. FIG. 4 shows a multidimensional reference system in which points 50 symbolize values which characterize disconnection noises of different disconnection units 2, for different disconnection currents. Each disconnection unit 2 is analysed for different disconnection currents, as mentioned above.

In a third step 104, processing that produces a grouping of the discrete values is carried out, so as to create decision-making categories 52. For example, a first category 52A groups together the values representative of an overload disconnection noise of 120 A low-rating units, a second category 52B groups together the values representative of a short-circuit disconnection noise of units with a rating of between 160 A and 630 A, etc.

Advantageously, during the learning phase, steps similar to steps 100 to 104 may be implemented this time with the switching units 4 present in the enclosure 1, such as contactors and remote switches, so that the detection device 6 learns not to detect the switching of these units.

Thus, in a fourth step 106, each switching unit 4 is tested by injecting it with a predetermined current in order to make it switch and to record the noise generated by the unit 4 upon switching (switching noise signal) by means of the microphone 12.

The preceding step is performed in order to collect time and frequency responses for each switching operation with a given current.

In a fifth step 108, said switching noise signals are discretized, being sent to a machine learning system, preferably the same as that already used in the second step 102, so as to obtain discrete switching values, as described above, in order to enrich the database already constructed due to steps 100 to 104. In FIG. 4, the points 54 represent values of switching noises of different switching units 4.

In a sixth step 110, the discrete switching values are distinguished from the discrete disconnection values, this step consisting in distinguishing the noises associated with the disconnection units 2 from the noises associated with the switching units. Each switching value that corresponds to a switching noise and which comes within a decision-making category 52 causes the decision-making category 52 to be adjusted so as to exclude it.

In FIG. 4, for example, the point 54 that comes within the perimeter of a category 52 causes a modification in which the volume of the category in question is reduced so as to exclude the point, giving a reduced category 52C.

The decision-making categories 52 are therefore linked and represent the acoustic signature of the tripping of the disconnection units 2.

As explained above, steps 100 to 110 form part of a first part of the method according to the present invention, called the learning phase.

Hereinafter, a second phase of the method according to the present invention, called the detection phase, will be described. The steps belonging to this second phase are implemented during the actual operation of the detection device 6 in the installation 1 and are for example implemented by the detection device 6 itself.

It is understood in particular that the steps of the second phase of the method may be implemented separately from the learning phase. For example, steps 100 to 110 may be replaced with the acquisition of a preconfigured database.

In a step 112, the electronic control unit 8 acquires, through the microphone 12, a signal of unit noise generated by one of the disconnection units 2 or switching units 4 of the electrical enclosure 1.

For example, the detection device 6 continuously records the noises in the enclosure 1 by means of the microphone 12. The noises may be recorded over a succession of successive time periods.

In a step 114, the device noise signal acquired is discretized, being sent to the neural network, and the value obtained is compared with the decision-making categories 52, which are defined in the database resulting from the learning.

If the value obtained comes within a decision-making category 52, the electronic control unit 8 sends, in a step 116, an alarm signal to the radio communication interface 10, which in turn transmits an alert signal. Preferably, the alert signal is transmitted to a portable unit of a customer.

Preferably, the electronic control unit 8 is capable of distinguishing between the decision-making categories 52. In this case, it also sends a signal representative of a category of the fault to the radio communication interface 10. The alert signal also contains this category signal information. By virtue of this information, the customer is able to respond according to the level of urgency and to intervene quickly if necessary.

Advantageously, the database resulting from the learning may be updated during the operation of the unit 6.

For example, if a false alarm is sent, the noise that generated it is used to modify the decision-making categories 52, by repeating the learning phase and therefore steps 106 to 110 of the method. For example, a user who went to inspect the enclosure 1 following a false alarm may indicate that it was a false alarm on their portable unit. The detection device 6 acquires this information and updates the database, for example by changing properties associated with the statistical attributes of the acoustic signature in question.

Advantageously, it is possible to add sounds specific to the tripping of a disconnection unit 2 in order to class it according to the criticality.

For example, one of the disconnection units 2 which is of critical importance is equipped, in the electrical enclosure, with a mechanical device or the like, such as a bell, so as to emit a specific sound during switching, this specific sound being different from the sound emitted by the other units of the enclosure. This specific sound is learnt beforehand by the detection device 6 through training, as described in the steps above.

Generally speaking, to clearly characterize the noises of the switching units 2, statistical attributes of these noises are defined, in order to characterize them so as to isolate them from other noises.

This step consists in analysing the time response and/or the frequency response of the noise in order to extract therefrom characteristics that are specific to the disconnection unit 2.

Figure 5:
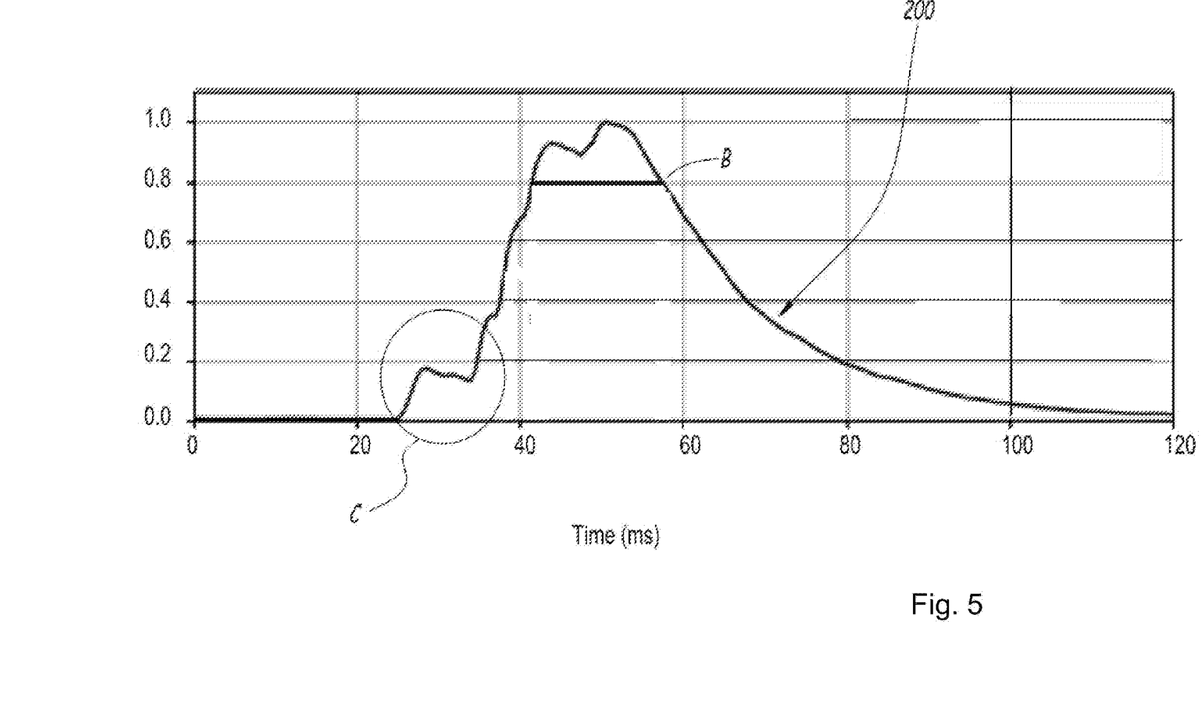
FIG. 5 is a graph showing an example of tripping noise of a disconnection unit recorded by the detection device of FIG. 1 and in which a first statistical attribute is defined.
Figure 6:
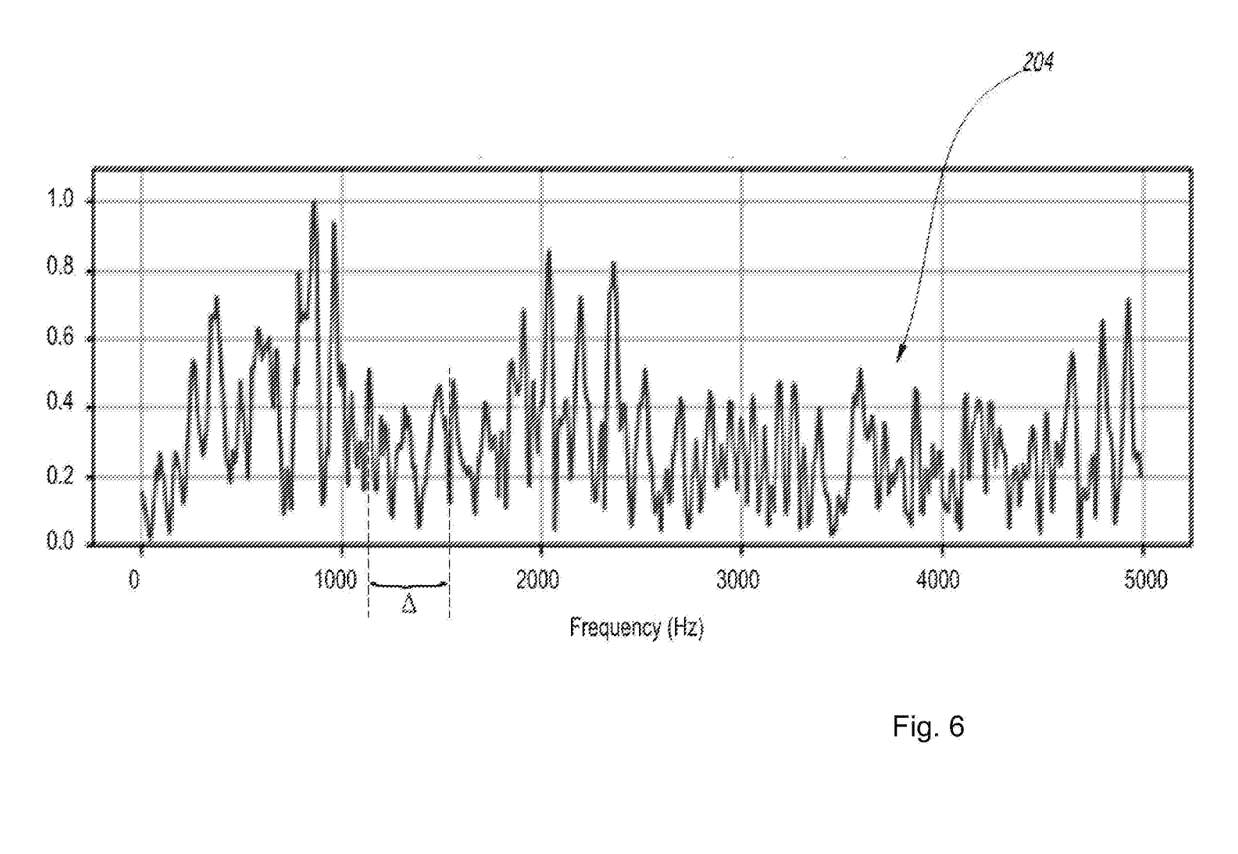
FIG. 6 is a graph showing an example of tripping noise of a disconnection unit recorded by the detection device of FIG. 1 and in which a second and a third statistical attributes are defined.
Figure 7:
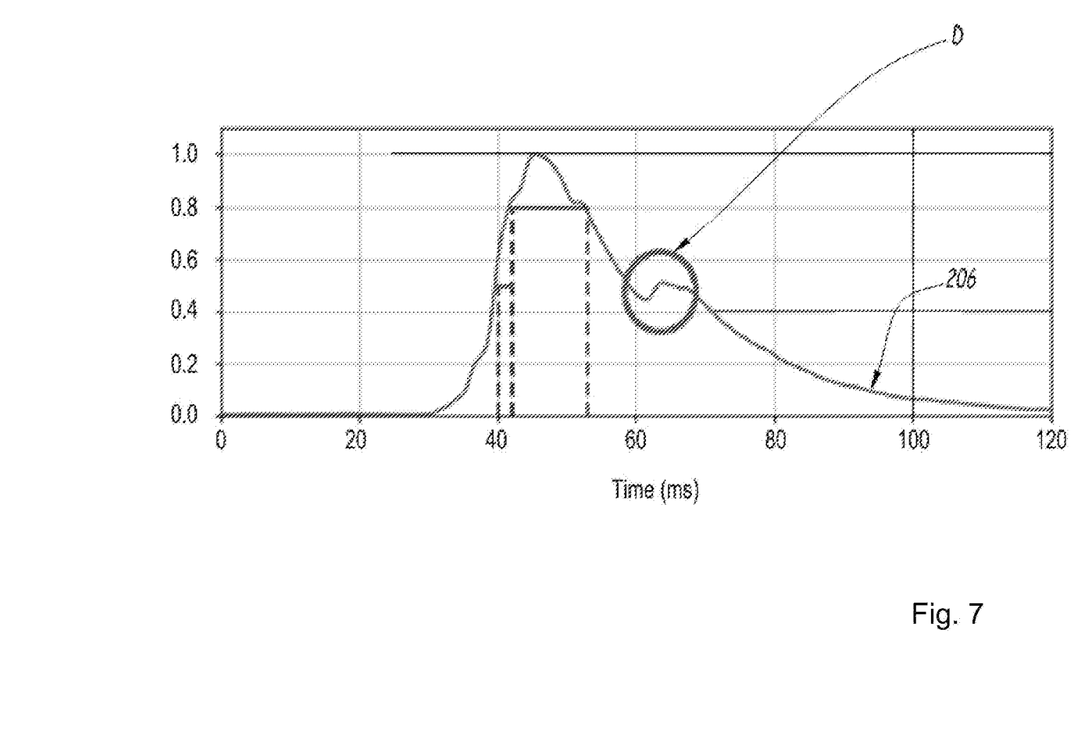
FIG. 7 is a graph showing an example of tripping noise of a disconnection unit recorded by the detection device of FIG. 1 and in which a fourth statistical attribute is defined.

FIGS. 5 to 7 are graphs each showing an example of noise of tripping of a disconnection unit recorded by the detection device 6 and in which different statistical attributes are defined.

In FIG. 5, it is possible to see a parameter B (or attribute B) on the time curve 200 representing the sound amplitude of the signal recorded as a function of time. The parameter B represents the duration (ms) for which the intensity of the disconnection noise signal remains higher than 80% of the maximum intensity of the disconnection noise signal.

Still in FIG. 5, it is possible to see a characteristic specific to differential circuit breakers. In differential circuit breakers, this shape commonly appears, and it is caused by the movement of a "loose" part present in the kinematic chain. To characterize this particular aspect of the signal, it is possible to define an attribute C on the time curve, this attribute C representing an inflection point measured 25 ms before reaching 80% of the intensity of the disconnection noise signal. The amplitude of the inflection should preferably be higher than 1.5% of the intensity of the disconnection noise signal.

In FIG. 6, it is possible to see a frequency curve 204 representing the sound amplitude of the signal recorded in the frequency domain, and it is possible to define a frequency attribute representative of a frequency range $\Delta$ that favours contactors, this frequency attribute being a measurement of the frequency at the first instance of reaching 100% of the intensity of the disconnection noise signal or a mean intensity of the disconnection noise signal greater than 46%.

In FIG. 7, it is possible to see a parameter D on the "tail" of the time signal 206 which is the measurement of a "bounce back", an inflection specific to the noise of a contactor.

Of course, these examples of statistical attributes are not limiting and other statistical attributes may be defined and used in addition to or instead of the statistical attributes defined above.

The embodiments and the variants contemplated above may be combined with one another so as to create new embodiments.

The invention claimed is:

1. A method for detecting a tripping of a disconnection unit in an electrical enclosure, the electrical enclosure comprising at least one disconnection unit for disconnecting electric current and at least one switching unit for switching the electric current, the method comprising a learning phase configured to generate decision-making categories associated with an acoustic signature of the tripping of said at least one disconnection unit, and a phase of detecting the tripping of the disconnection unit, comprising:
    acquiring a unit noise signal generated by at least one of said disconnection units for disconnecting the electric current or at least one switching unit for switching the electric current, and
    comparing said unit noise signal with said decision-making categories in order to detect whether the unit noise signal corresponds to the tripping of the disconnection unit,
    and wherein the learning phase comprises:
    injecting a predetermined disconnection current into the disconnection unit and recording the signal of the disconnection noise generated,
    sending the signal of the disconnection noise to a machine learning system configured to recognize the acoustic signature of the disconnection unit and providing discrete disconnection values as output, grouping the discrete disconnection values together so as to create the decision-making categories, injecting a predetermined current into the switching unit and recording the signal of the switching noise generated, sending the signal of the switching noise to the machine learning system and obtaining discrete switching values as output, and distinguishing the discrete switching values from the discrete disconnection values by modifying the decision-making categories so as to exclude discrete switching values which come within these decision-making categories.

2. The method according to claim 1, wherein the learning system is a neural network.

3. The method according to claim 1, wherein the detection phase comprises discretizing the signal of the unit noise acquired and comparing the value obtained with the decision-making categories and if the value obtained comes within a decision-making category, sending an alarm signal.

4. The method according to claim 3, wherein, when an alarm signal is sent, then no tripping takes place, the noise recorded which caused the alarm is used to modify the decision-making categories.

5. The method according to claim 1, wherein the injecting a predetermined disconnection current into the disconnection unit comprises injection of an overload disconnection current, injection of a differential current and injection of a short-circuit disconnection current in order to simulate different types of electrical faults.

6. The method according to claim 1, wherein the machine learning system defines at least one statistical attribute of the disconnection noise signal acquired in order to characterize the noise of the disconnection unit.

7. The method according to claim 6, wherein one or more of the statistical attributes are chosen from the group comprising:

the duration for which the intensity of the disconnection noise signal remains higher than a third predetermined percentage of the maximum intensity of the disconnection noise signal, an inflection point measured at a predetermined point in time before reaching a predetermined percentage of the maximum intensity of the disconnection noise signal, a frequency range corresponding to a measurement of the time of the first instance of reaching 100% of the intensity of the disconnection noise signal, or a mean intensity of the disconnection noise signal greater than a fourth predetermined percentage, and a measurement of the time of the first instance of reaching 100% of the intensity of the disconnection noise signal.

8. The method according to claim 1, wherein the unit noise signal is acquired continuously.

9. The method according to claim 1, wherein one of the disconnection units is modified to produce a specific sound during tripping, the specific sound being learned beforehand in the learning phase.

10. A detection device for detecting a tripping of a disconnection unit in an electrical enclosure comprising at least one disconnection unit for disconnecting electric current and at least one switching unit for switching the electric current, the detection device comprising an electronic control unit configured to execute the method for detecting a tripping according to claim 1, a communication interface connected to the electronic control unit configured to transmit an alert signal, and a microphone connected to the electronic control unit configured to acquire the unit noise signal, the disconnection noise signal and the switching noise signal.

11. An electrical enclosure comprising a detection device according to claim 10 installed inside the electrical enclosure, at the top of a pillar of the enclosure.

12. An electrical enclosure comprising a plurality of pillars, each pillar being equipped with a detection device according to claim 10, installed at the top of the enclosure, with the microphone sited remotely in a region to be monitored.

13. An electrical enclosure comprising a plurality of pillars with a single pillar being equipped with a detection device according to claim 10, placed at the top of the enclosure, with a plurality of microphones sited remotely in regions to be monitored in each pillar.

14. An electrical enclosure comprising a plurality of columns, some of which are divided into compartments, each compartment comprising a detection device according to claim 10.

* * * * *